(12) United States Patent
Xu et al.

(10) Patent No.: US 11,973,136 B2
(45) Date of Patent: Apr. 30, 2024

(54) FLEXIBLE MICROWAVE POWER TRANSISTOR AND PREPARATION METHOD THEREOF

(71) Applicant: University of Electronic Science and Technology of China, Sichuan (CN)

(72) Inventors: Yuehang Xu, Sichuan (CN); Yan Wang, Sichuan (CN); Yunqiu Wu, Sichuan (CN)

(73) Assignee: UNIVERSITY OF ELECTRONIC SCIENCE AND TECHNOLOGY OF CHINA, Sichuan (CN)

( * ) Notice: Subject to any disclaimer, the term of this patent is extended or adjusted under 35 U.S.C. 154(b) by 633 days.

(21) Appl. No.: 17/264,521

(22) PCT Filed: Dec. 20, 2019

(86) PCT No.: PCT/CN2019/126861
§ 371 (c)(1),
(2) Date: Jan. 29, 2021

(87) PCT Pub. No.: WO2021/120143
PCT Pub. Date: Jun. 24, 2021

(65) Prior Publication Data
US 2022/0102542 A1    Mar. 31, 2022

(51) Int. Cl.
*H01L 29/778* (2006.01)
*H01L 21/02* (2006.01)
(Continued)

(52) U.S. Cl.
CPC ........ *H01L 29/7786* (2013.01); *H01L 23/145* (2013.01); *H01L 29/2003* (2013.01); *H01L 29/66462* (2013.01)

(58) Field of Classification Search
CPC ............... H01L 29/7786; H01L 23/145; H01L 29/2003; H01L 29/66462; H01L 29/778;
(Continued)

(56) References Cited

U.S. PATENT DOCUMENTS 9,515,068 B1 * 12/2016 Patterson ............ H01L 21/8258
2003/0020092 A1 * 1/2003 Parikh ................. H01L 29/7783
257/E29.253
(Continued)

FOREIGN PATENT DOCUMENTS

CN    101719471 A    6/2010
CN    102054666 A    5/2011
(Continued)

OTHER PUBLICATIONS

Defrance et al, "Fabrication, Characterization, and Physical Analysis of AlGaN/GaN HEMTs on Flexible Substrates," IEEE Transactions on Electron Devices, vol. 60, No. 3, pp. 1054-1059 (Mar. 2013).
Int'l Search Report issued 09//27/2020 in Int'l Application No. PCT/CN2019/126861.

*Primary Examiner* — Herve-Louis Y Assouman
(74) *Attorney, Agent, or Firm* — Panitch Schwarze Belisario & Nadel LLP

(57) ABSTRACT

The present disclosure provides a flexible microwave power transistor and a preparation method thereof. In view of great lattice mismatch and poor performance of a device prepared with a Si substrate in an existing preparation method, the preparation method of the present disclosure grows a gallium nitride high electron mobility transistor (GaN HEMT) layer on a rigid silicon carbide (SiC) substrate to avoid lattice mismatch between a silicon (Si) substrate and gallium nitride (GaN), improving performance of the flexible microwave power transistor. Moreover, in view of problems such as low output power, power added efficiency and power gain
(Continued)

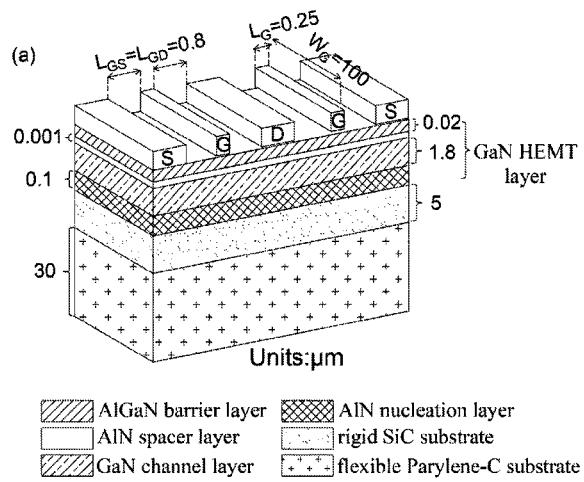

with the existing device preparation method, the present disclosure retains part of the rigid SiC substrate and grows a flexible substrates at room temperature to prepare a high-quality device. The present disclosure has greatly improved power output capability, efficiency and gain, and basically unchanged performance of device under 0.75% of stress.

6 Claims, 1 Drawing Sheet

(51) Int. Cl.
  *H01L 23/14* (2006.01)
  *H01L 29/20* (2006.01)
  *H01L 29/66* (2006.01)
(58) Field of Classification Search
  CPC .......... H01L 21/02378; H01L 21/0254; H01L 23/3738
  See application file for complete search history.

(56) References Cited

U.S. PATENT DOCUMENTS

| | | | | |
|---|---|---|---|---|
| 2013/0341635 | A1* | 12/2013 | Cao | H01L 29/7786 438/172 |
| 2014/0257052 | A1* | 9/2014 | Muller | A61B 5/0031 600/378 |
| 2015/0076672 | A1* | 3/2015 | Hosseini | H01L 23/49838 438/107 |
| 2015/0287597 | A1* | 10/2015 | Kitabayashi | H01L 21/6836 438/602 |
| 2016/0240679 | A1* | 8/2016 | Chen | H01L 29/205 |
| 2017/0365689 | A1 | 12/2017 | Sato | |
| 2019/0305744 | A1* | 10/2019 | Perahia | H03H 9/132 |

FOREIGN PATENT DOCUMENTS

| | | |
|---|---|---|
| CN | 102214568 A | 10/2011 |
| CN | 109148368 A | 1/2019 |
| CN | 110148561 A | 8/2019 |

* cited by examiner

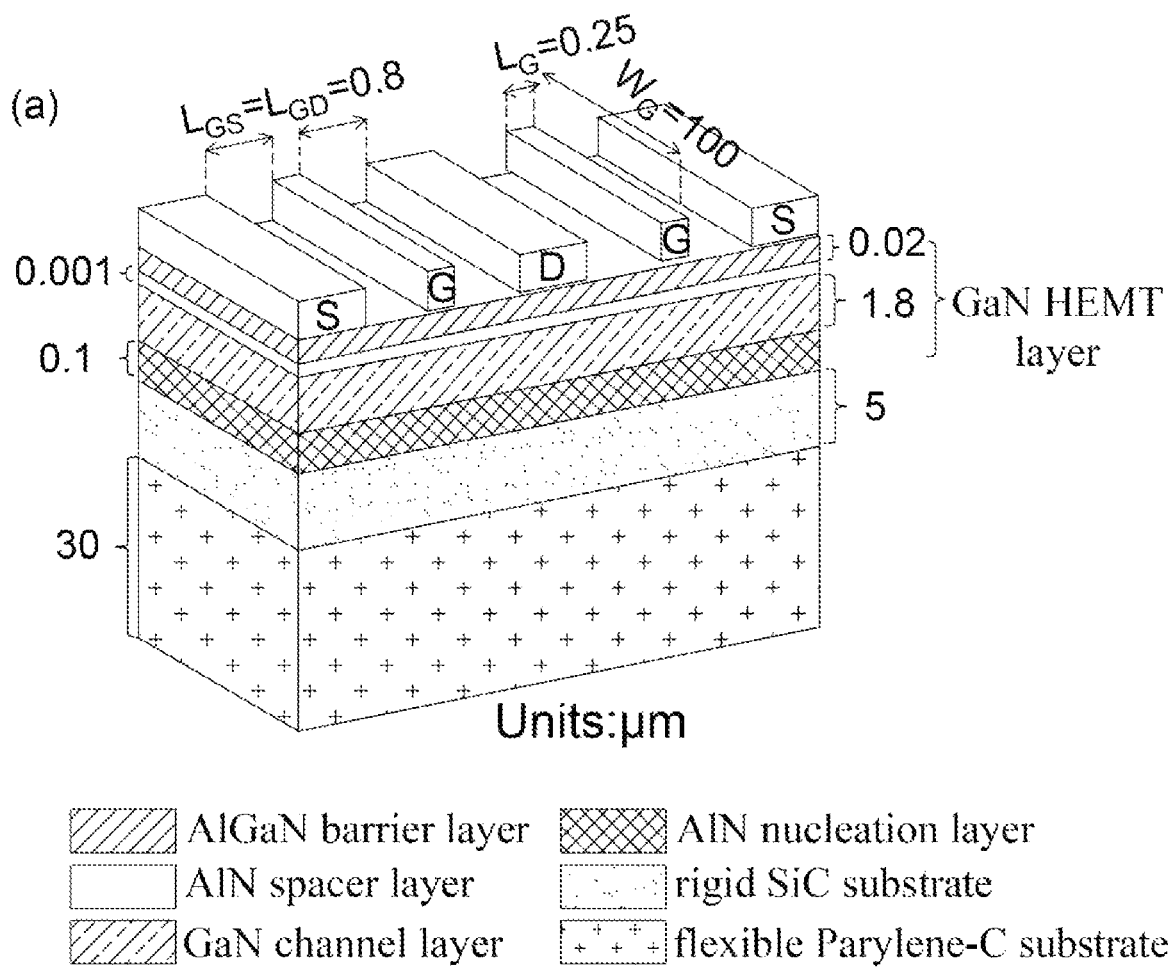

FIG. 1

```
┌─────────────────────────────────────────────────────────────────┐
│ Prepare a GaN HEMT layer on an upper surface of a rigid SiC substrate │──201
│            to obtain a rigid microwave power transistor          │
└─────────────────────────────────────────────────────────────────┘
                                  ▼
┌─────────────────────────────────────────────────────────────────┐
│  Thin the rigid SiC substrate so that a thinned rigid SiC substrate has a │
│  thickness less than or equal to 5 μm, so as to obtain a thinned rigid   │──202
│                    microwave power transistor                    │
└─────────────────────────────────────────────────────────────────┘
                                  ▼
┌─────────────────────────────────────────────────────────────────┐
│    Grow a flexible Parylene-C substrate on the SiC substrate of the │
│ thinned rigid microwave power transistor at room temperature to obtain │──203
│              a flexible microwave power transistor               │
└─────────────────────────────────────────────────────────────────┘
```

FIG. 2

FLEXIBLE MICROWAVE POWER TRANSISTOR AND PREPARATION METHOD THEREOF

CROSS-REFERENCE TO RELATED APPLICATION

This application is a Section 371 of International Application No. PCT/CN2019/126861, filed Dec. 20, 2019, which has not yet published, the disclosure of which is incorporated herein by reference.

TECHNICAL FIELD

The present disclosure relates to the technical field of microwave power devices, in particular to a flexible microwave power transistor and a preparation method thereof.

BACKGROUND

With the advent of the 5G era, there are increasing demands for power capacity of a wireless transmission system. Along with the development requirements of a small size and a low cost, flexible microwave power devices are considered to have great application prospects. Due to high power, high efficiency and high frequency of gallium nitride high electron mobility transistors (GaN HEMTs), flexible GaN HEMTs are gradually turning into a research hot spot.

Since gallium nitride (GaN) has relatively poor stress property, preparation of flexible GaN HEMTs has always been a problem. N. Defrance et al. proposed a preparation method [N. Defrance, F. Lecourt, Y. Douvry, M. Lesecq, V. Hoel, A. L. des Etangs-Levallois, Y. Cordier, A. Ebongue, and J. C. De Jaeger, "Fabrication, characterization, and physical analysis of AlGaN/GaN HEMTs on flexible substrates," in IEEE Trans. Electron Devices, vol. 60, no. 3, pp. 1054-1059] in which a GaN HEMT structure was prepared on a Si substrate, and a flexible GaN HEMT was obtained through a thinning and transferring process. Although the Si substrate can be easily removed, severe lattice mismatch between the Si substrate and GaN may be produced, resulting in poor device performance. That is, an existing preparation method is implemented by preparing a device with a Si substrate and then transferring a thinned device to a flexible substrate. The method has two disadvantages: 1. The device prepared with the Si substrate has great lattice mismatch and poor device performance. 2. The traditional method completely removes the hard Si substrate, and transfers the thinned device. During transfer, the device may be easily deformed. Thus, damage to the device can be easily caused. Moreover, a traditional transferring method may easily lead to air bubbles (gaps) at a contact interface between the flexible substrate and the device, reducing heat dissipation performance.

Therefore, it is advantageous to reduce lattice mismatch between a substrate and a GaN and improve performance of a flexible microwave power transistor.

SUMMARY

An objective of the present disclosure is to provide a flexible microwave power transistor and a preparation method thereof, so as to reduce lattice mismatch between a silicon (Si) substrate and GaN in a traditional method, and reduce damage of a device during preparation, thereby improving performance of the flexible microwave power transistor.

To achieve the above purpose, the present disclosure provides the following technical solutions.

A flexible microwave power transistor includes from bottom to top: a flexible Parylene-C substrate, a rigid silicon carbide (SiC) substrate, and a gallium nitride high electron mobility transistor (GaN HEMT) layer, where the rigid SiC substrate has a thickness less than or equal to 5 μm.

Optionally, the GaN HEMT layer includes an AlN nucleation layer, a GaN channel layer, an AlN spacer layer and an AlGaN barrier layer from bottom to top.

Optionally, the AlN nucleation layer, the GaN channel layer, the AlN spacer layer and the AlGaN barrier layer have a thickness of 0.1 μm, 1.8 μm, 0.001 μm, and 0.02 μm respectively.

Optionally, the flexible Parylene-C substrate has a thickness of 30 μm.

Optionally, a gate, a source, and a drain are further provided on the GaN HEMT layer.

A method for preparing a flexible microwave power transistor includes the following steps:

preparing a GaN HEMT layer on an upper surface of a rigid SiC substrate to obtain a rigid microwave power transistor, thinning a lower surface of the rigid SiC substrate so that a thinned rigid SiC substrate has a thickness less than or equal to 5 μm, so as to obtain a thinned rigid microwave power transistor, and growing a flexible Parylene-C substrate on a lower surface of the rigid SiC substrate of the thinned rigid microwave power transistor at room temperature to obtain a flexible microwave power transistor.

Optionally, the thinning a lower surface of the rigid SiC substrate so that a thinned rigid SiC substrate has a thickness less than or equal to 5 μm, so as to obtain a thinned rigid microwave power transistor, specifically includes:

mechanically grinding and thinning a lower surface of the rigid SiC substrate, so that a mechanically ground and thinned rigid SiC substrate has a thickness less than or equal to 100 μm, so as to obtain a mechanically ground rigid microwave power transistor;

turning over the mechanically ground rigid microwave power transistor and fixing on a silicon (Si) wafer;

using a dry etching machine to etch the lower surface of the rigid SiC substrate of the mechanically ground rigid microwave power transistor, so that an etched rigid SiC substrate has a thickness less than or equal to 5 μm, so as to obtain a thinned rigid microwave power transistor.

Optionally, the growing a flexible Parylene-C substrate on a lower surface of the rigid SiC substrate of the thinned rigid microwave power transistor at room temperature to obtain a flexible microwave power transistor, specifically includes:

growing a flexible Parylene-C substrate on a lower surface of the rigid SiC substrate of the thinned rigid microwave power transistor fixed upside down on the Si wafer at room temperature to obtain a flexible microwave power transistor embryo;

immersing the flexible microwave power transistor embryo in acetone, heating in a water bath, removing silicon oil, and releasing a device to obtain a flexible microwave power transistor.

According to specific embodiments of the present disclosure, the present disclosure has the following technical effects:

The present disclosure provides a flexible microwave power transistor and a preparation method thereof. In view of great lattice mismatch and poor performance of the device prepared with a Si substrate in the existing preparation method, the preparation method of the present disclosure grows a GaN HEMT layer on a rigid silicon carbide (SiC) substrate to avoid lattice mismatch between the Si substrate and GaN, improving performance of the flexible microwave power transistor. Moreover, in view of problems such as low output power, power added efficiency and power gain with the existing device preparation method, the present disclosure retains part of the rigid SiC substrate to provide excellent heat dissipation transition, improving heat dissipation of the device. The present disclosure also grows a flexible substrate at room temperature to prepare a high-quality device with damage controlled at a low level, in which the flexible substrate is in close contact with the device, generating few air bubbles and gaps and improving heat dissipation. Compared with the traditional method, the present disclosure has greatly improved power output capability, efficiency and gain, and basically unchanged performance of device under 0.75% of stress.

BRIEF DESCRIPTION OF DRAWINGS

In order to illustrate embodiments of the present disclosure or technical solutions of the prior art, the accompanying drawings to be used will be described briefly below. Notably, the following accompanying drawings merely illustrate some embodiments of the present disclosure, but other accompanying drawings can also be obtained by those of ordinary skill in the art based on the accompanying drawings without any creative efforts.

FIG. 1 is a schematic structural diagram of a flexible microwave power transistor provided by the present disclosure.

FIG. 2 is a flow chart of a method for preparing the flexible microwave power transistor provided by the present disclosure.

DETAILED DESCRIPTION

The following texts clearly and completely describe the technical solutions in the embodiments of the present disclosure with reference to accompanying drawings in the embodiments of the present disclosure. Apparently, the described embodiments are merely part of rather than all of the embodiments of the present disclosure. All other embodiments obtained by a person of ordinary skill in the art based on the embodiments of the present disclosure without creative efforts shall fall within the protection scope of the present disclosure.

An objective of the present disclosure is to provide a flexible microwave power transistor and a preparation method thereof, so as to reduce a lattice mismatch between a Si substrate and GaN in a traditional method, and reduce damage to a device during preparation, thereby improving performance of the flexible microwave power transistor.

To make the above objective, features, and advantages of the present disclosure clearer and more comprehensible, the present disclosure is further described in detail below with reference to the accompanying drawings and specific embodiments.

To achieve the above objective, the present disclosure provides the following technical solutions:

As shown in FIG. 1, the present disclosure provides a flexible microwave power transistor, which includes from bottom to top: a flexible Parylene-C substrate, a rigid SiC substrate, and a GaN HEMT layer, where the rigid SiC substrate has a thickness less than or equal to 5 μm.

The GaN HEMT layer includes an AlN nucleation layer, a GaN channel layer, an AlN spacer layer and an AlGaN barrier layer from bottom to top. The AlN nucleation layer, the GaN channel layer, the AlN spacer layer and the AlGaN barrier layer may have a thickness of 0.1 μm, 1.8 μm, 0.001 μm, and 0.02 μm respectively. Optionally, the flexible Parylene-C substrate has a thickness of 30 μm. The AlN nucleation layer is used to reduce tension caused by lattice mismatch between the substrate and the channel, and acts as a buffer. The GaN channel layer forms a layer of channel for carrier transportation. The AlN spacer layer is used to reduce scattering from channel. The AlGaN barrier layer is used to provide a certain barrier height for gate Schottky contact.

A gate (G), a source (S), and a drain (D) are further provided on the GaN HEMT layer. The gate, the source and the drain correspond to G, S and D in FIG. 1, in which gate length LG is 250 nm, gate width $W_G$ is 100 μm, gate index is 10, and distances between the gate and the source LGS and between the gate and the drain $L_{GD}$ are 800 nm.

As shown FIG. 2, the present disclosure also provides a method for preparing a flexible microwave power transistor, including the following steps:

Step 201: preparing a GaN HEMT layer on an upper surface of a rigid SiC substrate to obtain a rigid microwave power transistor.

In the present disclosure, a microwave power transistor (GaN HEMT) with a large gate wide is prepared on a rigid substrate of SiC wafer. The reason for selecting the material is explained as follows: A high electron mobility transistor (HEMT) based on GaN has large power capacity and high output power. At the same time, the SiC substrate has high conductivity, leading to small lattice mismatch of GaN during HEMT preparation and excellent device performance. A traditional method uses a Si substrate which leads to large lattice mismatch and poor device performance. After the device is prepared, I-V test, S parameter test and power test are performed to verify the performance.

Step 202: thinning a lower surface of the rigid SiC substrate so that a thinned rigid SiC substrate has a thickness less than or equal to 5 μm, so as to obtain a thinned rigid microwave power transistor.

The step 202 implemented by thinning a lower surface of the rigid SiC substrate so that a thinned rigid SiC substrate has a thickness less than or equal to 5 μm, so as to obtain a thinned rigid microwave power transistor, specifically includes:

Mechanically grinding and thinning a lower surface of the rigid SiC substrate, so that the thinned rigid SiC substrate has a thickness less than or equal to 100 μm, so as to obtain a mechanically ground rigid microwave power transistor. Specifically, the rigid SiC substrate of the whole SiC wafer (rigid microwave power transistor) prepared in step 201 is mechanically ground, thinned, and polished until the substrate has a thickness less than or equal to 100 μm.

The thinned rigid microwave power transistor is turned over and fixed on a Si wafer. Specifically, a thinned device (the mechanically ground rigid microwave power transistor) is turned over and fixed on a Si wafer via silicon oil which is used for heat dissipation. Turning over is carried out to thin the substrate which is at the bottom.

A dry etching machine is used to etch the lower surface of the rigid SiC substrate of the rigid microwave power transistor, so that an etched rigid SiC substrate has a thickness less than or equal to 5 μm, so as to obtain a thinned rigid microwave power transistor. Specifically, the etching can be carried out with a whole wafer (the entire thinned rigid microwave power transistor). Or it can be carried out by dicing and selecting several small dies for etching. The dicing is carried out to reduce the cost. The fixed rigid microwave power transistor is put into a dry etching machine to etch the SiC substrate on the backside. A corresponding etching gas chemically reacts with the substrate, and the SiC is etched to a thickness less than or equal to 5 µm by adjusting etching rate and etching time. Part of the substrate (5 µm) is retained to help reduce interfacial tension and lattice mismatch of the device, effectively improving device performance.

Step 203: growing a flexible Parylene-C substrate on a lower surface of the rigid SiC substrate of the thinned rigid microwave power transistor at room temperature to obtain a flexible microwave power transistor.

The step 203 implemented by growing a flexible Parylene-C substrate on a lower surface of the rigid SiC substrate of the thinned rigid microwave power transistor at room temperature to obtain a flexible microwave power transistor, specifically includes:

Growing a flexible Parylene-C substrate on a lower surface of the rigid SiC substrate of the thinned rigid microwave power transistor fixed on a Si wafer at room temperature to obtain a flexible microwave power transistor embryo. Specifically, the thinned rigid microwave power transistor is fixed on a Si wafer. Parylene-C is grown on the thinned SiC substrate at room temperature by chemical vapor deposition (CVD) to a thickness determined based on flexibility requirements. Since the thickness is inversely proportional to the flexibility, adjustment can be made to meet different flexibility requirements. Parylene-C is chosen as a material for flexible substrate since it grows at a low temperature in a simple process and has desired film forming property. This process enables replacement of substrate without moving the device at room temperature. In a traditional method, a thinned device is transferred to a flexible substrate. But in the present disclosure, a device is kept unmoved and a flexible substrate is applied to the device, so that the device suffers minimal damage during this process.

The flexible microwave power transistor embryo is immersed in acetone and heated in a water bath. The silicon oil is removed, and the device is released to obtain a flexible microwave power transistor. Specifically, after a growth process is completed, the device is immersed in acetone and heated in a water bath. The silicon oil is removed, and the device is released in a solution to obtain a flexible microwave power transistor.

According to specific embodiments of the present disclosure, the present disclosure has the following technical effects:

An existing method is implemented by preparing a device with a Si substrate and then transferring a thinned device to a flexible substrate. The method has two disadvantages: 1. The device prepared with the Si substrate has great lattice mismatch and poor device performance. 2. The traditional method completely removes the Si substrate, and transfers the thinned device. During transfer process, the device may be easily deformed. Thus, damage to the device can be easily caused. Moreover, after the Si substrate is removed, the flexible substrate has poor heat dissipation performance, and bubbles and gaps can be easily generated during a transfer process, which further reduces the heat dissipation performance. In view of the first point of the disadvantages and in comparison with the existing method, the present disclosure uses a SiC substrate which leads to small lattice mismatch and improved device performance. In view of the second point, the present disclosure directly grows a Parylene-C flexible substrate on the back of the device at room temperature. At the same time, part of the hard SiC substrate is retained, ensuring high quality of contact interface between the substrate and the device, increasing thermal conductivity and minimizing device damage during the transfer process.

Each equivalent embodiment of the present specification is described in a progressive manner, each embodiment focuses on the differences from other embodiments, and the same and similar parts between the equivalent embodiments may refer to each other.

The principles and implementations of the present disclosure have been described with reference to specific embodiments. The description of the above embodiments is only for facilitating understanding of the method and the core idea of the present disclosure, and the described embodiments are only a part of the embodiments of the present disclosure. All other embodiments obtained by a person of ordinary skill in the art based on the embodiments of the present disclosure without creative efforts shall fall within the scope of the present disclosure.

What is claimed is:

1. A flexible microwave power transistor, comprising from bottom to top: a flexible Parylene-C substrate, a rigid silicon carbide (SiC) substrate, and a gallium nitride high electron mobility transistor (GaN HEMT) layer,
   wherein the rigid SiC substrate has a thickness less than or equal to 5 µm;
   the GaN HEMT layer comprises an AlN nucleation layer, a GaN channel layer, an AlN spacer layer and an AlGaN barrier layer from bottom to top; and
   the AlN nucleation layer, the GaN channel layer, the AlN spacer layer and the AlGaN barrier layer have a thickness of 0.1 µm, 1.8 µm, 0.001 µm, and 0.02 µm respectively.

2. The flexible microwave power transistor according to claim 1, wherein the flexible Parylene-C substrate has a thickness of 30 µm.

3. The flexible microwave power transistor according to claim 1, wherein a gate, a source, and a drain are further provided on the GaN HEMT layer.

4. A method for preparing the flexible microwave power transistor of claim 1, comprising the following steps:
   preparing a GaN HEMT layer on an upper surface of a rigid SiC substrate to obtain a rigid microwave power transistor,
   thinning a lower surface of the rigid SiC substrate so that a thinned rigid SiC substrate has a thickness less than or equal to 5 so as to obtain a thinned rigid microwave power transistor, and
   growing a flexible Parylene-C substrate on a lower surface of the rigid SiC substrate of the thinned rigid microwave power transistor at room temperature to obtain a flexible microwave power transistor.

5. The method for preparing a flexible microwave power transistor according to claim 4, wherein the thinning a lower surface of the rigid SiC substrate so that a thinned rigid SiC substrate has a thickness less than or equal to 5 µm, so as to obtain a thinned rigid microwave power transistor, specifically comprises:
   mechanically grinding and thinning a lower surface of the rigid SiC substrate, so that a mechanically ground and thinned rigid SiC substrate has a thickness less than or equal to 100 µm, so as to obtain a mechanically ground rigid microwave power transistor;
   turning over the mechanically ground rigid microwave power transistor and fixing on a silicon (Si) wafer;
   using a dry etching machine to etch the lower surface of the rigid SiC substrate of the mechanically ground rigid microwave power transistor, so that an etched rigid SiC substrate has a thickness less than or equal to 5 µm, so as to obtain a thinned rigid microwave power transistor.

6. The method for preparing a flexible microwave power transistor according to claim 5, wherein the growing a flexible Parylene-C substrate on a lower surface of the rigid SiC substrate of the thinned rigid microwave power transistor at room temperature to obtain a flexible microwave power transistor, specifically comprises:

growing a flexible Parylene-C substrate on a lower surface of the rigid SiC substrate of the thinned rigid microwave power transistor fixed on the Si wafer at room temperature to obtain a flexible microwave power transistor embryo;

immersing the flexible microwave power transistor embryo in acetone, heating in a water bath, removing silicon oil, and releasing a device to obtain a flexible microwave power transistor.

\* \* \* \* \*